(12) United States Patent
Tweet et al.

(10) Patent No.: US 7,045,832 B2
(45) Date of Patent: *May 16, 2006

(54) VERTICAL OPTICAL PATH STRUCTURE FOR INFRARED PHOTODETECTION

(75) Inventors: Douglas J. Tweet, Camas, WA (US);
Jong-Jan Lee, Camas, WA (US);
Jer-Shen Maa, Vancouver, WA (US);
Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 132 days.

This patent is subject to a terminal disclaimer.

(21) Appl. No.: 10/755,567

(22) Filed: Jan. 12, 2004

(65) Prior Publication Data

US 2005/0153474 A1    Jul. 14, 2005

Related U.S. Application Data (63) Continuation-in-part of application No. 10/746,952, filed on Dec. 23, 2003.

(51) Int. Cl.
*H01L 29/732* (2006.01)
*G01J 5/20* (2006.01)

(52) U.S. Cl. ............... 257/184; 257/436; 257/466; 257/616; 250/338.4

(58) Field of Classification Search ............... 257/431, 257/436, 184, 186, 616, 622, 623, 466; 250/338.4

See application file for complete search history.

(56) References Cited

U.S. PATENT DOCUMENTS

| | | | | |
|---|---|---|---|---|
| 4,601,964 A | * | 7/1986 | Saitoh et al. | 430/84 |
| 5,994,724 A | * | 11/1999 | Morikawa | 257/184 |
| 6,307,242 B1 | * | 10/2001 | Sugiyama | 257/432 |
| 2005/0127275 A1 | * | 6/2005 | Yang | 250/214 R |
| 2005/0133723 A1 | * | 6/2005 | Lee et al. | 250/338.4 |
| 2005/0153474 A1 | * | 7/2005 | Tweet et al. | 438/69 |

OTHER PUBLICATIONS

C.K. Maiti, N.B. Chakrabarti and S.K. Ray, Strained Silicon Heterostructures: Materials and Devices, Chapter 10: Si/SiGe Optoelectronics, Published by The Institution of Electrical Engineer, 2001, Dec. 2001.

S. Murtaza et.al., "Room Temperature Electroabsorption in $Ge_xSi_{1-x}$ PIN Photodide," IEEE Trans. on Electron Devices, 2297-2300, vol. 41, No. 12, 1994, Dec. 1994.

(Continued)

*Primary Examiner*—Mark V. Prenty
(74) *Attorney, Agent, or Firm*—Law Office of Gerald Maliszewski; Gerald Maliszewski

(57) ABSTRACT

Provided are a SiGe vertical optical path and a method for selectively forming a SiGe optical path normal structure for IR photodetection. The method comprises: forming a Si substrate surface; forming a Si feature, normal with respect to the Si substrate surface, such as a trench, via, or pillar; and, selectively forming a SiGe optical path overlying the Si normal feature. In some aspects, the Si substrate surface is formed a first plane and the Si normal feature has walls (sidewalls), normal with respect to the Si substrate surface, and a surface in a second plane, parallel to the first plane. Then, selectively forming a SiGe optical path overlying the Si normal feature includes forming a SiGe vertical optical path overlying the normal feature walls.

18 Claims, 5 Drawing Sheets

OTHER PUBLICATIONS

T. Tashiro et.al., "A Selective Epitaxial SiGe/Si Planar Photodetector for Si-Based OEIC's," IEEE Trans. on Electron Devices, 545-550, vol. 44, No. 4, 1997, Apr. 1997.

A. Vonsovici et.al., "Room Temperature Photocurrent Spectroscopy of SiGe/Si p-i-n Photodiodes Grown by Selective Epitaxy," IEEE Trans. on Electron Devices, 538-542, vol. 45, No. 2, 1998, Feb. 1998.

R.E. Jones et.al., "Fabrication and Modeling of Gigahertz Photodetectors in Heteroepitaxial Ge-on-Si using Graded Buffer Layer Deposited by Low Energy Plasma Enhanced CVD," IEDM, 2002, Dec. 2002.

* cited by examiner

DEPOSITED DIELECTRIC; e.g. $SiO_2$

Fig. 6b

DEPOSITED DIELECTRIC; e.g. $SiO_2$

THINNER ON SIDE-WALLS

VERTICAL OPTICAL PATH STRUCTURE FOR INFRARED PHOTODETECTION

RELATED APPLICATIONS

This application is a continuation-in-part of a pending patent application entitled, SURFACE-NORMAL OPTICAL PATH STRUCTURE FOR INFRARED PHOTODETECTION, invented by Lee et al., Ser. No. 10/746,952, filed Dec. 23, 2003.

BACKGROUND OF THE INVENTION

1. Field of the Invention

This invention generally relates to integrated circuit (IC) fabrication processes and, more particularly, to a surface-normal vertical optical path structure and corresponding fabrication method.

2. Description of the Related Art

There are many applications for photodetection in the near infrared region (the wavelength between 0.7 micron to 2 microns), such as in fiber-optical communication, security, and thermal imaging. Although III-V compound semiconductors provide superior optical performance over their silicon (Si)-based counterparts, the use of Si is desirable, as the compatibility of Si-based materials with conventional Si-IC technology promises the possibility of cheap, small, and highly integrated optical systems.

Silicon photodiodes are widely used as photodetectors in the visible light wavelengths due to their low dark current and the above-mentioned compatibility with Si IC technologies. Further, silicon-germanium ($Si_{1-x}Ge_x$) permits the photodetection of light in the 0.8 to 1.6 micron wavelength region.

However, the SiGe alloy has larger lattice constant than the Si lattice, so film thickness is a critical variable in the epitaxial growth of SiGe on Si substrates. While a thick SiGe is desirable for light absorption, too thick of a SiGe film causes a defect generation that is responsible for dark currents. This critical SiGe thickness is dependent upon the Ge concentration and device process temperature. Higher Ge concentrations and higher device process temperatures result in the formation of thinner SiGe film thicknesses. In common practice, the SiGe critical thickness is in the range of a few hundred angstroms, to maximum of a few thousand angstroms. Once the SiGe thickness is grown beyond its critical thickness, lattice defects in SiGe are inevitable. As mentioned above, an IR photo detector built from a SiGe film with lattice defects generates large dark currents and noise.

Quantum efficiency is a measure of the number of electron-hole pairs generated per incident photon, and it is a parameter for photodetector sensitivity. Quantum efficiency is defined as:

$$\eta = (I_p/q)/(P_{opt}/h\nu)$$

where $I_p$ is the current generated by the absorption of incident optical power $P_{opt}$ at the light frequency $\nu$.

Figure 1:
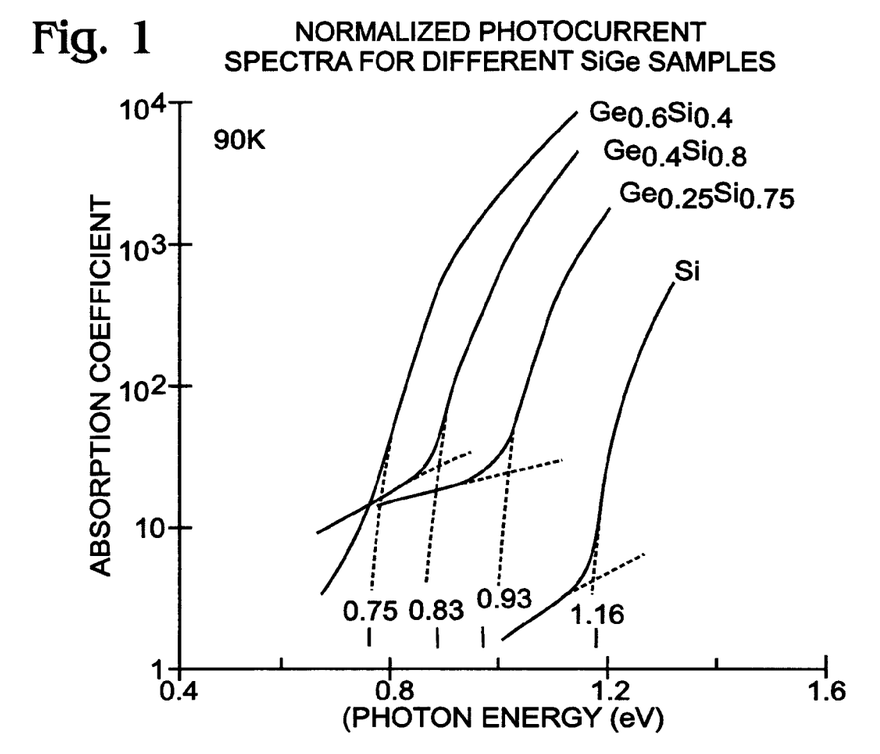
FIG. 1 is a graph showing the relationship between quantum efficiency and the percentage of Ge in a SiGe film.

FIG. 1 is a graph showing the relationship between quantum efficiency and the percentage of Ge in a SiGe film. One of the key factors in determining quantum efficiency is the absorption coefficient, $\alpha$. Silicon has a cutoff wavelength of about 1.1 microns and is transparent in the wavelength region between 1.3 to 1.6 microns. The SiGe absorption edge shifts to the red with an increasing Ge mole fraction and is shown in FIG. 1. The absorption coefficient of any SiGe alloy is relatively small and the limited thickness dictated by the critical thickness further limits the ability of SiGe films to absorb photons.

As noted above, the major goals of SiGe-based photodetection are high quantum efficiency and the integration of these SiGe photodetectors with the existing Si electronics. One way to increase the optical path, and improve the quantum efficiency, is to form the optical path in the same plane as the SiGe film, along the substrate surface in which the SiGe is deposited. Thus, light propagates parallel to the heterojunction (SiGe/Si) interface. However, this optical path design necessarily limits the design of IR detectors.

The IR absorption length of SiGe is long and thus a thick SiGe layer, greater than 1 micron for example, is required to achieve high IR absorption and high quantum efficiency. However, it is very difficult to grow a defect-free thick SiGe film on a Si substrate because of the lattice mismatch between these two materials. As described in pending application SURFACE-NORMAL OPTICAL PATH STRUCTURE FOR INFRARED PHOTODETECTION, Ser. No. 10/746,952, filed on Dec. 23, 2003, which is incorporated herein by reference, a long SiGe optical path can be formed without necessarily forming a thick SiGe film. By growing the SiGe film on the sidewall of a Si trench or pillar, any IR light entering the device and traveling along the sidewall, encounters a long optical path. A long optical path improves the quantum efficiency.

However, growing the SiGe by a blanket deposition technique results in SiGe growth on the bottom of the trenches and top of the wafer, as well as on the sidewalls. Although SiGe has a larger lattice constant than Si, it can be grown lattice-matched to Si, up to the so-called critical thickness. Consequently, SiGe grown on the sidewalls has the Si lattice constant parallel to the sidewalls, but a larger lattice constant perpendicular to them. At the same time, the SiGe grown at the bottom of the trenches and top of the wafer has the Si lattice constant parallel to those surfaces, but a larger one perpendicular to them. Crystals originating from these different surfaces consequently have defected regions where they meet.

It would be advantageous if the above-mentioned intersecting lattice problem could be solved for use in a long length SiGe optical path structure.

It would be advantageous the intersecting lattice problem could be solved by growing SiGe on the trench sidewall, but not the trench bottoms.

SUMMARY OF THE INVENTION

The present invention SiGe optical path structure absorbs IR wavelength light that is normal to a silicon substrate surface and parallel to the SiGe/Si heterojunction interface, increasing the length of the optical path. Therefore, a two-dimensional IR image detection can be realized with a thin SiGe film thickness. Because of the relatively poor quantum efficiencies associated with SiGe, the IR absorption length of SiGe must be long, and conventionally a thick SiGe layer is needed to absorb high amounts of IR energy. However, it is very difficult to grow defect-free thick SiGe film on Si substrate because of the lattice mismatch between these two materials. The present invention eliminates the need for a thick SiGe film. SiGe film is grown on the sidewall of a Si substrate trench or pillar, forming a relatively long optical path for light normal to the substrate surface. The present invention's use of relatively thin SiGe films permits a SiGe IR photodetector to be easily integrated with Si CMOS devices. As a result of the SiGe only being grown on the sidewalls, a better SiGe crystalline structure is obtained, improving the performance of the IR detector.

Accordingly, a method is provided for selectively forming a SiGe optical path normal structure for IR photodetection. The method comprises: forming a Si substrate surface; forming a Si feature, normal with respect to the Si substrate surface, such as a trench, via, or pillar; and, selectively forming a SiGe optical path overlying the Si normal feature. In some aspects, the Si substrate surface is formed in a first plane and the Si normal feature has walls (sidewalls), normal with respect to the Si substrate surface, and a surface in a second plane, parallel to the first plane. Then, selectively forming a SiGe optical path overlying the Si normal feature includes forming a SiGe vertical optical path overlying the normal feature walls.

In some aspects, the Si substrate surface is associated with a silicon-on-insulator (SOI) material including the Si substrate, a buried oxide (BOX) layer overlying the Si substrate, and a top Si layer overlying the BOX. If the Si normal feature is a pillar, then the method comprises: blanket depositing a dielectric layer: selectively etching the dielectric overlying the Si substrate surface where the pillar is to formed; and, etching the Si top layer to the level of BOX to form the pillar. If a via or trench is the Si normal feature, then the method comprises: blanket depositing a dielectric layer overlying the Si substrate surface; selectively etching the dielectric overlying the Si substrate surface where the normal feature is to formed; and, etching the Si top layer to the level of BOX to form the normal feature.

If a bulk Si substrate is used, the method comprises: non-conformally depositing the dielectric to form a first thickness of dielectric over the Si substrate surface and normal feature surface, and a second layer of dielectric, less than the first thickness, overlying the normal feature walls; and, etching to remove the second thickness of dielectric.

Additional details of the above-described method and a SiGe vertical optical path structure are provided below.

DETAILED DESCRIPTION OF THE PREFERRED EMBODIMENTS

Figure 2:
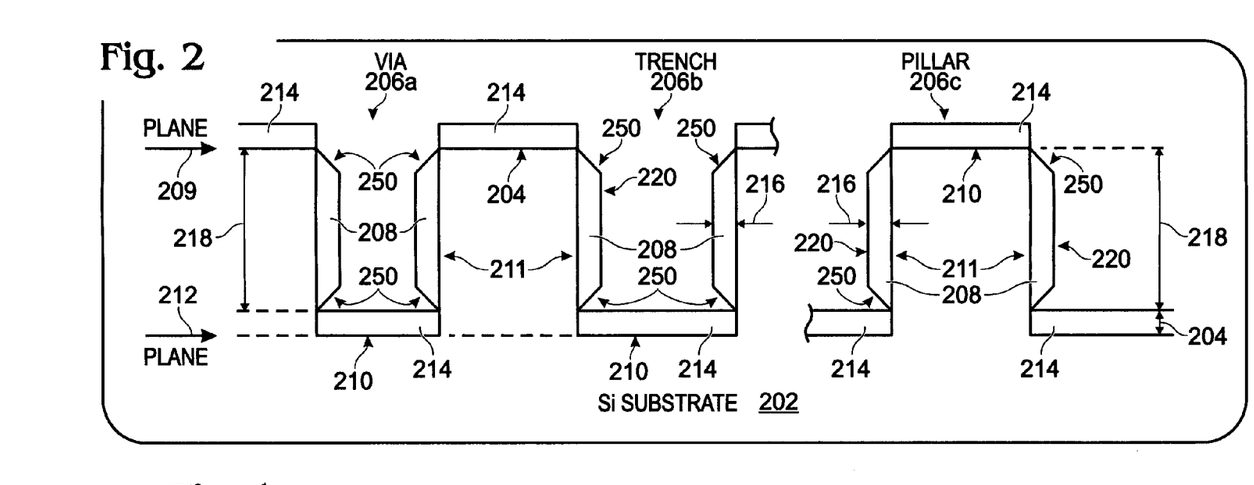
FIG. 2 is a cross-sectional view of the present invention SiGe vertical optical path structure for IR photodetection.

FIG. 2 is a cross-sectional view of the present invention SiGe vertical optical path structure for IR photodetection. The structure 200 comprises a Si substrate 202 with a surface 204. A Si feature 206 is normal with respect to the Si substrate surface 204. A SiGe vertical optical path 208 is formed overlying the Si normal feature 206. The SiGe vertical optical path 208 is normal with respect to the Si substrate surface 204. The Si normal feature 206 can be a via 206a, a trench 206b, or a pillar 206c. FIG. 2 shows an example of each type of feature 206a/206b/206c.

More specifically, the Si substrate surface 204 is formed in a first (horizontal) plane. The normal feature 206 includes walls 211, normal with respect to the Si substrate surface 204. The normal feature 206 also includes a surface 210 in a second plane, parallel to the first plane. With respect to the via 206a and trench 206b, the first plane is shown as plane 209 and the second plane is shown as plane 212. With respect to the pillar 206c, the first plane is shown as plane 212 and the second plane is shown as plane 209. The SiGe vertical optical path 208 is formed overlying the normal feature walls 211.

A dielectric layer 214 overlies the Si substrate surface 204 and the normal feature surface 210. The SiGe vertical optical path 208 has a thickness 216 in the range of 5 to 1000 nanometers (nm). The SiGe vertical optical path 208 has an optical path length 218 in the range of 0.1 to 10 microns. As shown, the Si substrate 202 is a bulk Si substrate.

In some aspects, the SiGe vertical optical path 208 includes SiGe with a Ge concentration in the range from 5 to 100%. Typically, the graded Ge concentration increases with respect to the deposition thickness. That is, the Ge concentration is lower at the interface with normal feature wall 211, than it is at the vertical optical path surface 220. For example, the SiGe vertical optical path 208 may have an X concentration of Ge at the normal feature wall interface 211, a Y concentration of Ge at a SiGe optical path normal structure surface 220, where Y>X, $0 \leq X \leq 0.3$, and $Y \leq 1$, and the SiGe deposition thickness 216 is in the range of 0.1 to 1 microns.

Figure 3:
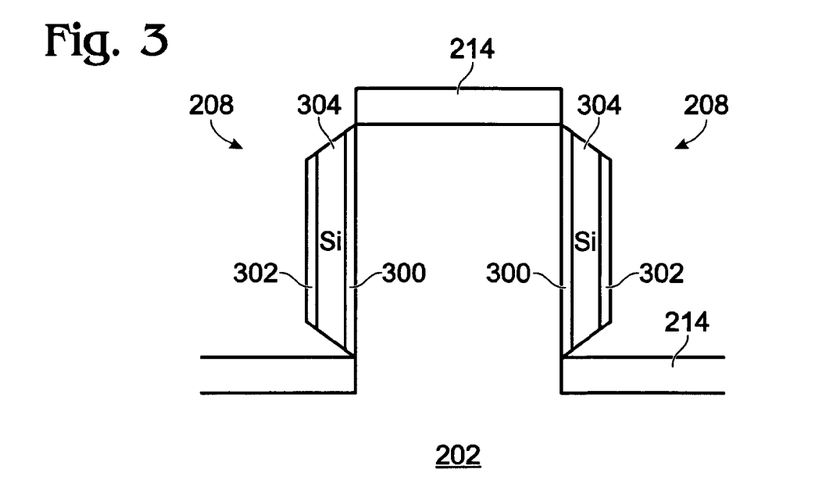
FIG. 3 is a partial cross-sectional view illustrating another aspect of the SiGe vertical optical path of FIG. 2.

FIG. 3 is a partial cross-sectional view illustrating another aspect of the SiGe vertical optical path 208 of FIG. 2. As shown, the SiGe vertical optical path 208 may include a plurality of SiGe layers 300 and 302, where a Si layer 304 is interposed between SiGe layers 300/302. Although a two-layer SiGe structure is shown in the figure, the present invention is not limited to any particular number of SiGe layers. A pillar normal feature is shown in the figure, however, multilayered SiGe layers can also be formed overlying via or trench sidewalls (not shown). Further, a multilayered SiGe optical path can be formed using either a bulk Si substrate or an SOI material.

Although an optical path 208 is shown with two SiGe layers (300/302) and a single interposing Si layer 304, the present invention is not limited to any particular number of SiGe/Si interfaces or layers. Further, the final SiGe layer (302 in this example) may fill the via or trench normal feature.

Figure 4:
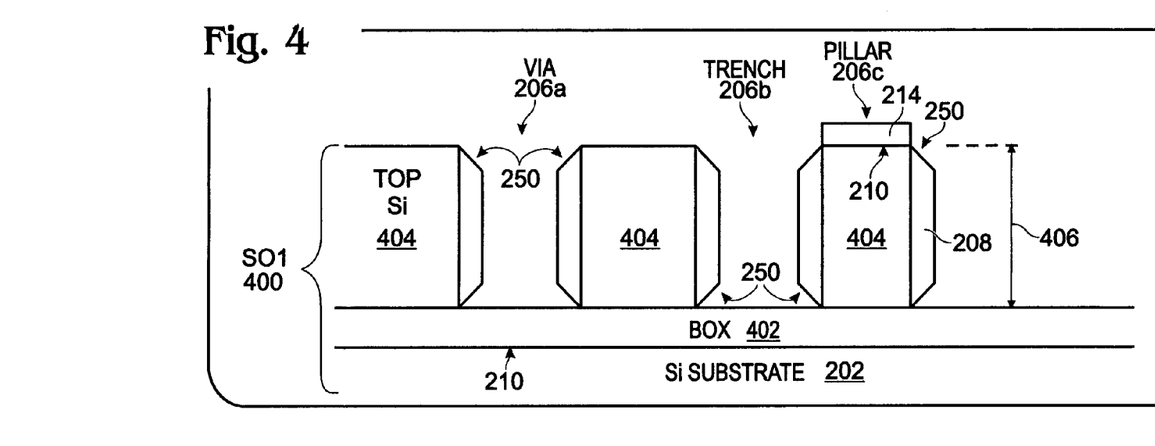
FIG. 4 is a partial cross-sectional view of a silicon-on-insulator (SOI) aspect of the present invention.

FIG. 4 is a partial cross-sectional view of a silicon-on-insulator (SOI) aspect of the present invention. That is, the SOI 400 includes the Si substrate 202, a buried oxide (BOX) layer 402 overlying the Si substrate 202, and a top Si layer 404 overlying the BOX 402. If the normal feature is a pillar 206c, it is formed in the top Si layer 404 of the SOI 400 and the dielectric layer overlying the Si substrate surface 202 is BOX 402. In this case, a dielectric layer is deposited over the pillar surface 210. In some aspects, additional Si (not shown) is grown overlying the top Si layer 404, for applications where CMOS circuitry is to be formed on the SOI material 400.

Likewise, if the Si normal feature is a via 206a or a trench 206b, they are also formed in the top Si layer 404 of the SOI 400. However, now the dielectric layer overlying the normal feature surface 210 is BOX 402. In some aspects, the top Si layer 404 has a thickness 406 in the range of 0.1 to 2 microns.

Referencing either FIG. 2 or FIG. 4, in some aspects the structure 200 further comprises facets 250 in the SiGe vertical optical path 208. The facets 250 are adjacent the dielectric layer overlying the Si substrate surface 204 and the normal feature surfaces 210. In other aspects, the SiGe vertical optical path 208 is single crystal SiGe.

Functional Description

As mentioned above in the Background Section, a simple blanket deposition of SiGe, to form the optical path structure, often results in defects where SiGe originating from the sidewalls, meets the SiGe grown from the bottom of the trench or top of the wafer. This problem can be avoided by first depositing a silicon dioxide layer, or other dielectric, over the patterned wafer surface. If the oxide has comparatively poor step coverage, the oxide on the sidewalls is thinner than that on the top of the wafer or at the bottom of the trenches. Any standard wet silicon dioxide etch can then be used to remove the oxide from the sidewalls, while leaving some on the other (horizontal) surfaces. Any conventional selective SiGe deposition technique can then be used to grow defect-free SiGe films on the sidewalls.

Figure 5A:
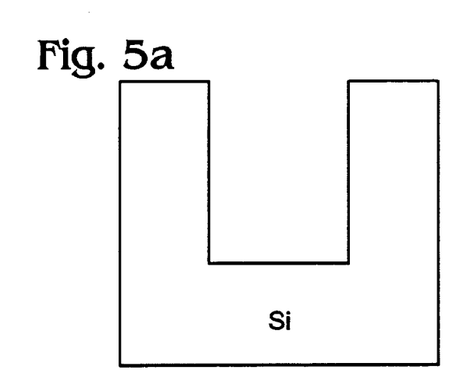
FIGS. 5a and 5b illustrate an initial step in the fabrication of the present invention SiGe vertical optical path.
Figure 5B:
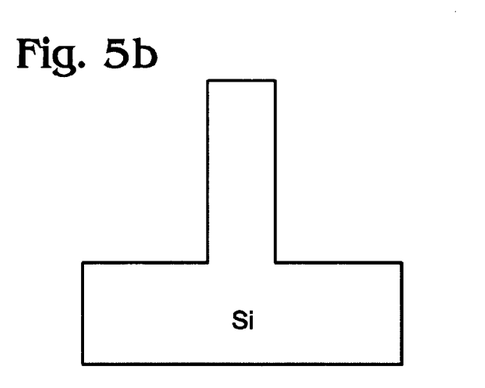

FIGS. 5a and 5b illustrate an initial step in the fabrication of the present invention SiGe vertical optical path. The vertical optical path structure is formed by, first, creating a Si surface normal to the Si substrate. This surface normal feature can be formed through any conventional Si IC process. A trench is shown in FIG. 5a, a pillar is shown in FIG. 5b.

Figure 6A:
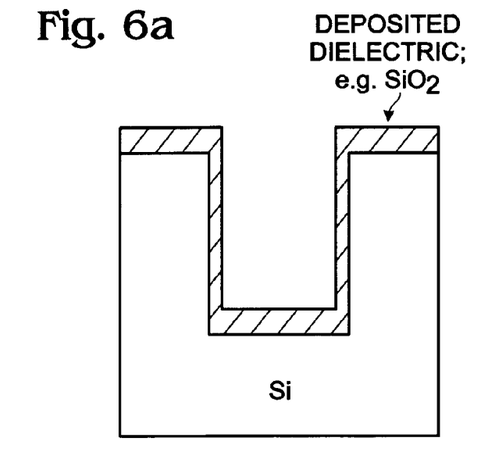
FIGS. 6a and 6b illustrate the structures of FIGS. 5a and 5b following a dielectric deposition step.
Figure 6B:
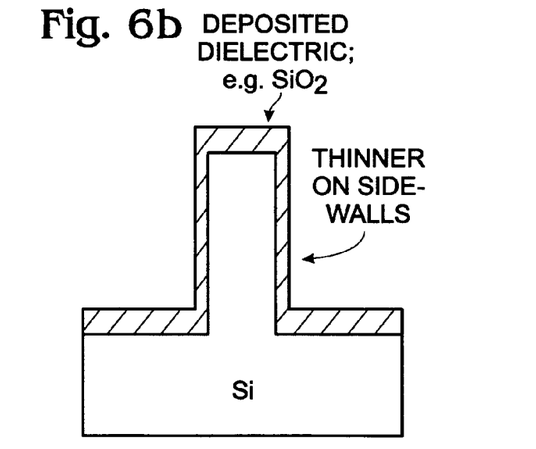

FIGS. 6a and 6b illustrate the structures of FIGS. 5a and 5b following a dielectric deposition step. A dielectric layer is deposited with comparatively poor step coverage. This can be achieved using any of a number of conventional methods that are well known to those skilled in the art. One example is a high-density plasma oxide. The dielectric thickness is larger on the top and bottom surfaces than the sidewalls of the patterned structures. Silicon dioxide is shown as the dielectric in the examples, however, silicon oxynitride or silicon nitride may also be used.

Figure 7A:
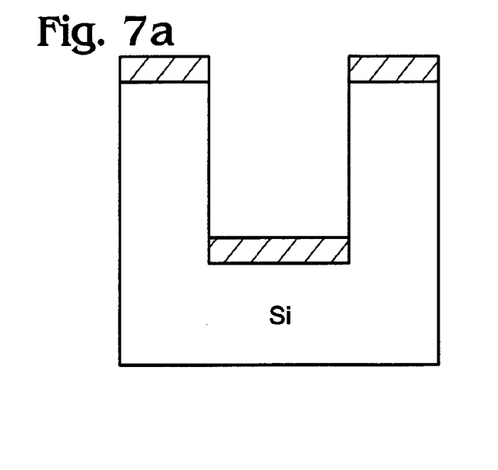
FIGS. 7a and 7b illustrate the structures of FIGS. 6a and 6b following a dielectric etching step.
Figure 7B:
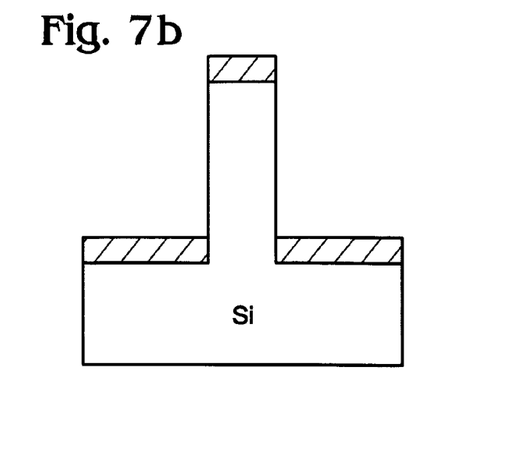

FIGS. 7a and 7b illustrate the structures of FIGS. 6a and 6b following a dielectric etching step. The dielectric is removed from the sidewalls but allowed to remain on the top and bottom regions (normal feature surfaces) through the use of any well-characterized etch. For example, $SiO_2$ can be removed by a buffered HF solution with a known etch rate.

Figure 8A:
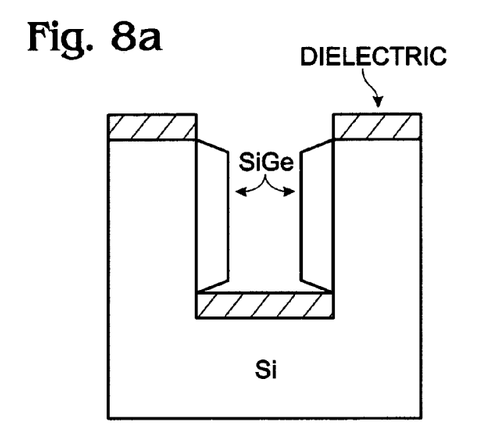
FIGS. 8a and 8b illustrate the structures of FIGS. 7a and 7b following a SiGe deposition step.
Figure 8B:
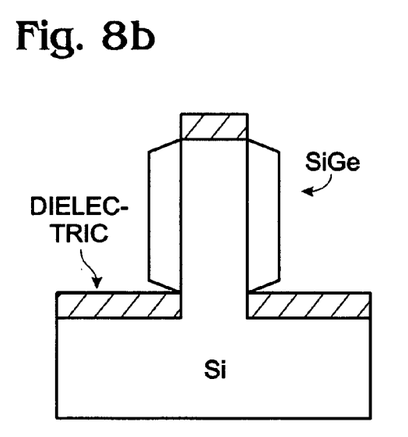

FIGS. 8a and 8b illustrate the structures of FIGS. 7a and 7b following a SiGe deposition step. After appropriate cleaning steps, SiGe can be deposited epitaxially on the sidewalls, with no growth on the dielectric regions, through the use of any conventional selective SiGe deposition method. For example, dichlorosilane with germane and HCl in a hydrogen ambient may be used. The SiGe can have either a fixed Ge concentration or a graded concentration. The thickness is typically kept under the critical thickness, as defined above, to avoid dislocation formation. Epitaxial Si may then be selectively deposited for use in a p-i-n device, for example, or alternating layers of Si and SiGe with various Ge concentrations can be selectively deposited for a quantum well-based device.

Figure 9A:
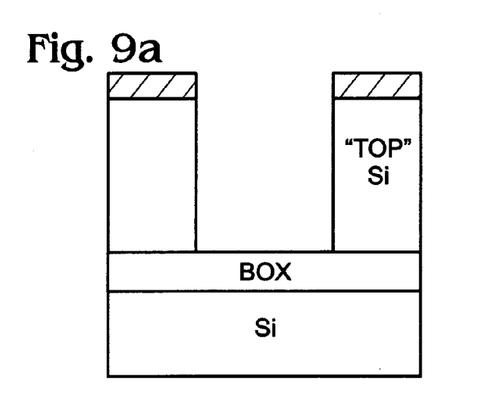
FIGS. 9a and 9b illustrate initial fabrication steps in silicon-on-insulator (SOI) aspect of the SiGe vertical optical path.
Figure 9B:
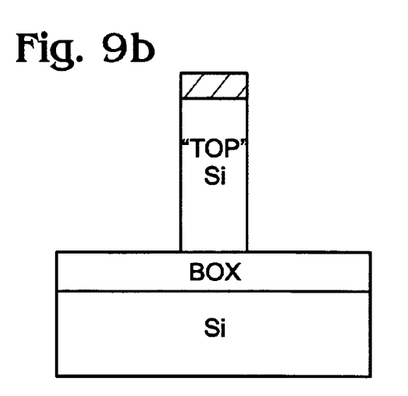

FIGS. 9a and 9b illustrate initial fabrication steps in silicon-on-insulator (SOI) aspect of the SiGe vertical optical path. The SOI substrate has a buried oxide (BOX) between the Si substrate and a thin "Top Si" layer. In this case, the process starts with some previously performed steps (not shown). Beginning with an un-patterned SOI wafer, a blanket oxide is deposited, or a blanket thermal oxide is grown. Then, the wafer is etched to form the desired pattern of trenches or hole (FIG. 9a), or a pillar (FIG. 9b). After cleaning and healing any etch damage, SiGe can then be selectively grown on the sidewalls of the top Si, similar to the manner shown in FIGS. 8a and 8b.

For normally incident infrared light, the present invention vertical optical path structures increase the optical path length through the SiGe, improving quantum efficiency, without having to form a micron-thick SiGe layer that is prone to lattice defects. The present invention vertical optical path structure can be used to fabricate highly efficient IR photo detectors associated with devices that include, but are not limited to, pn diodes, p-i-n type diodes, heterojunction phototransistors, quantum well photodiodes, and Schottky diodes. Standard CMOS devices can be integrated with the IR detectors on a single Si wafer.

Figure 10:
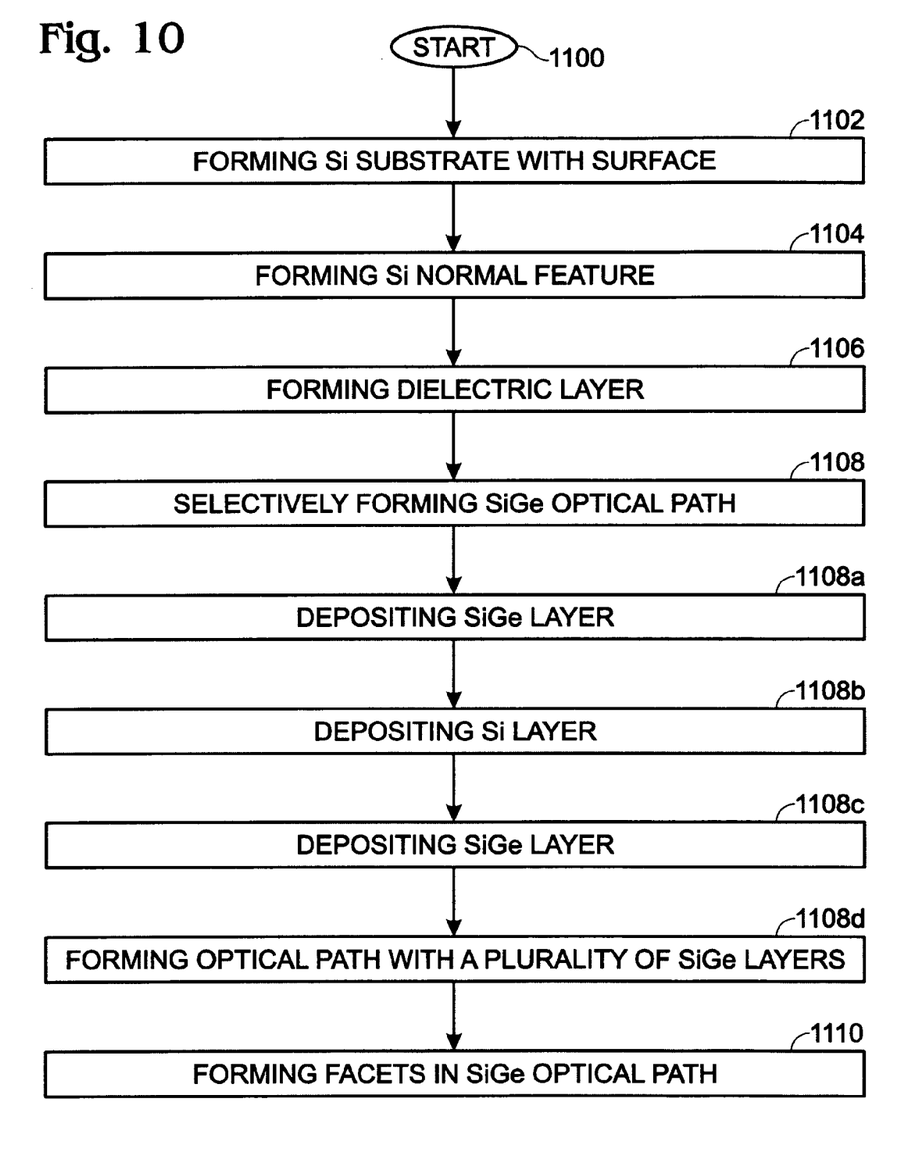
FIG. 10 is a flowchart illustrating the present invention method for selectively forming a SiGe optical path normal structure for IR photodetection.

FIG. 10 is a flowchart illustrating the present invention method for selectively forming a SiGe optical path normal structure for IR photodetection. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 1100.

Step 1102 forms a Si substrate surface. Step 1104 forms a Si feature, normal with respect to the Si substrate surface. Exemplary Si normal features include a via, trench, or pillar. However, the method is applicable to other, more complicated structures having at least one sidewall. Step 1106, prior to selectively forming the SiGe vertical optical path (Step 1108), forms a dielectric layer overlying the Si substrate surface and the normal feature surface. The dielectric may be deposited using a plasma chemical vapor deposition or a high-density plasma (HDP) deposition processes. However, other conventional process can also be used. Step 1108 selectively forms a SiGe optical path overlying the Si normal feature. In one aspect, Step 1108 forms a single crystal SiGe optical path. Some aspects of the method include an additional step, Step 1110 of, forming facets in the SiGe vertical optical path adjacent the dielectric overlying the Si substrate and normal feature surfaces.

In some aspects of the method, forming a Si substrate surface includes (Step 1102) forming a Si substrate with a surface in a first plane. Forming a Si normal feature in Step 1104 includes forming a feature with walls, normal with respect to the Si substrate surface, and a surface in a second plane, parallel to the first plane. Then, selectively forming a SiGe optical path overlying the Si normal feature (Step 1108) includes forming a SiGe vertical optical path overlying the normal feature walls.

In some aspects, forming a SiGe vertical optical path in Step 1108 includes depositing SiGe to a thickness in the range of 5 to 1000 nanometers (nm). In other aspects, Step 1108 forms a SiGe normal structure having an optical path length in the range of 0.1 to 10 microns. In yet another aspect, Step 1108 deposits SiGe with a Ge concentration in the range from 5 to 100%. Further, the deposited SiGe may have a graded Ge concentration that increases with respect to the deposition thickness. For example, the SiGe may have an X concentration of Ge at the normal feature wall interface, a Y concentration of Ge at a SiGe film top surface, where $Y>X$, $0 \leq X \leq 0.3$, and $Y \leq 1$, and the SiGe deposition thickness is in the range of 0.1 to 1 microns.

In other aspects, forming a SiGe vertical optical path in Step 1108 includes substeps. Step 1108a deposits a SiGe layer. Step 1108b deposits a Si layer overlying the SiGe.

Step 1108c deposits SiGe overlying the Si layer, and Step 1108d forms an optical path with a plurality of SiGe layers. Although two SiGe layers have been described, the method is not limited to any particular number of SiGe layers.

In another aspect, Step 1102 forms a SOI material including the Si substrate, a BOX layer overlying the Si substrate, and a top Si layer overlying the BOX. In some aspects, the top Si layer has a thickness in the range of 0.1 to 2 microns. If Step 1104 forms a pillar, then forming a dielectric layer overlying the normal feature surface in Step 1106 includes blanket depositing a dielectric layer. Further, forming a dielectric layer overlying the Si substrate surface (Step 1106) includes: selectively etching the dielectric overlying the Si substrate surface where the pillar is to formed; and, etching the Si top layer to the level of BOX to form the pillar.

If Step 1104 forms either a via or a trench, then forming a dielectric layer overlying the Si substrate surface (Step 1106) includes blanket depositing a dielectric layer overlying the Si substrate surface. Further, forming a dielectric layer overlying the normal feature surface (Step 1106) includes: selectively etching the dielectric overlying the Si substrate surface where the normal feature is to formed; and, etching the Si top layer to the level of BOX to form the normal feature.

Alternately, if Step 1102 forms a bulk Si substrate with a surface, then Step 1106, of forming a dielectric layer overlying the Si substrate surface and normal feature surface includes substeps (not shown). Step 1106a non-conformally deposits the dielectric to form a first thickness of dielectric over the Si substrate surface and normal feature surface, and a second layer of dielectric, less than the first thickness, overlying the normal feature walls. Step 1106b etches to remove the second thickness of dielectric.

A SiGe vertical optical path structure and corresponding selective SiGe deposition process have been presented. Simple surface-normal features such as vias, trenches, and pillars have been used to illustrate the invention. However, the invention may also be applied to more complicated features. Likewise, although SiGe films have been described, the invention is not necessarily limited to a particular light-absorbing film or a particular wavelength of light. Other variations and embodiments of the invention will occur to those skilled in the art.

We claim:

1. A silicon-germanium (SiGe) vertical optical path structure for infrared (IR) photodetection, the structure comprising:
   a Si substrate with a surface in a first plane;
   a Si feature, normal with respect to the Si substrate surface, wherein the normal feature includes walls, normal with respect to the Si substrate surface, and a surface in a second plane, parallel to the first plane; and,
   a SiGe vertical optical path, formed overlying the Si normal feature walls, normal with respect to the Si substrate surface.

2. The structure of claim 1 further comprising:
   a dielectric layer overlying the Si substrate surface and the normal feature surface.

3. The structure of claim 1 wherein the Si normal feature is selected from the group including a via, trench, and pillar.

4. The structure of claim 1 wherein the SiGe vertical optical path has a thickness in the range of 5 to 1000 nanometers (nm).

5. The structure of claim 1 wherein the SiGe vertical optical path has an optical path length in the range of 0.1 to 10 microns.

6. The structure of claim 1 wherein the SiGe vertical optical path includes SiGe with a Ge concentration in the range from 5 to 100%.

7. The structure of claim 1 wherein the SiGe vertical optical path includes SiGe with a graded Ge concentration that increases with respect to deposition thickness.

8. The structure of claim 7 wherein the SiGe vertical optical path has an X concentration of Ge at the normal feature wall interface, a Y concentration of Ge at a SiGe optical path normal structure surface, where Y>X, $0 \leq X \leq 0.3$, and $Y \leq 1$, and the SiGe deposition thickness is in the range of 0.1 to 1 microns.

9. The structure of claim 1 wherein the SiGe vertical optical path includes a plurality of SiGe layers, where a Si layer is interposed between SiGe layers.

10. The structure of claim 2 wherein the Si substrate is included in a silicon-on-insulator (SOI) material that further includes a buried oxide (BOX) layer overlying the Si substrate, and a top Si layer overlying the BOX;
    wherein the normal feature is a pillar formed in the top Si layer of the SOI; and,
    wherein the dielectric layer overlying the Si substrate surface is BOX.

11. The structure of claim 10 wherein the top Si layer overlying the BOX has a thickness in the range of 0.1 to 2 microns.

12. The structure of claim 2 wherein the Si substrate is included in a SOI substrate, further including a BOX layer overlying the Si substrate, and a top Si layer overlying the BOX;
    wherein the Si normal feature is selected from the group including a via and a trench, and formed in the top Si layer of the SOI;
    wherein the dielectric layer overlying the normal feature surface is BOX.

13. The structure of claim 12 wherein the top Si layer has a thickness in the range of 0.1 to 2 microns.

14. The structure of claim 1 wherein the Si substrate is a bulk Si substrate.

15. The structure of claim 2 further comprising:
    facets in the SiGe vertical optical path, adjacent the dielectric layer overlying the Si substrate and normal feature surfaces.

16. The structure of claim 1 wherein the SiGe vertical optical path is single crystal SiGe.

17. A silicon-germanium (SiGe) vertical optical path structure for infrared (IR) photodetection, the structure comprising:
    a bulk Si substrate with a horizontal surface;
    a Si feature, normal with respect to the Si substrate surface; and,
    a SiGe vertical optical path, formed overlying the Si normal feature, normal with respect to the Si substrate surface.

18. A silicon-germanium (SiGe) vertical optical path structure for infrared (IR) photodetection, the structure comprising:
    a Si substrate with a horizontal surface;
    a Si feature, normal with respect to the Si substrate surface; and,
    a SiGe vertical optical path, formed overlying the Si normal feature, normal with respect to the Si substrate surface, and including a plurality of SiGe layers, where a Si layer is interposed between SiGe layers.

* * * * *